United States Patent
Oh

(10) Patent No.: US 8,963,067 B2
(45) Date of Patent: Feb. 24, 2015

(54) IMAGE SENSOR AND METHODS OF DRIVING AND FABRICATING THE SAME

(75) Inventor: Hak Soo Oh, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 246 days.

(21) Appl. No.: 13/536,500

(22) Filed: Jun. 28, 2012

(65) Prior Publication Data

US 2013/0161485 A1 Jun. 27, 2013

(30) Foreign Application Priority Data

Dec. 26, 2011 (KR) ........................ 10-2011-0142587

(51) Int. Cl.
*H01L 27/148* (2006.01)

(52) U.S. Cl.
USPC ........................................ 250/208.1; 348/297

(58) Field of Classification Search
USPC ................... 250/208.1; 348/308, 297, 302
See application file for complete search history.

(56) References Cited

U.S. PATENT DOCUMENTS

| | | | |
|---|---|---|---|
| 7,323,671 B1 * | 1/2008 | Toros et al. | 250/208.1 |
| 7,800,673 B2 | 9/2010 | Sugawa et al. | |
| 7,902,574 B2 | 3/2011 | Adachi | |
| 8,217,328 B2 * | 7/2012 | Yin et al. | 250/208.1 |
| 8,575,533 B2 * | 11/2013 | Yen et al. | 250/208.1 |
| 2006/0181622 A1 | 8/2006 | Hong | |
| 2008/0012973 A1 * | 1/2008 | Park et al. | 348/294 |
| 2008/0273105 A1 | 11/2008 | Tanaka et al. | |

FOREIGN PATENT DOCUMENTS

| | | |
|---|---|---|
| JP | 2008-305983 A | 12/2008 |
| KR | 10-2006-0030513 A | 4/2006 |
| KR | 10-0782308 | 12/2007 |
| KR | 10-2008-0085117 | 9/2008 |

OTHER PUBLICATIONS

Narui Tei; Solid-State Imaging Element; English Abstract of JP 2008-305983; Dec. 18, 2008.

* cited by examiner

*Primary Examiner* — Tony Ko
(74) *Attorney, Agent, or Firm* — Andrew D. Fortney; Central California IP Group, P.C.

(57) ABSTRACT

An image sensor includes a plurality of pixels, wherein each of the pixels includes a storage unit configured to electrically connect with a floating diffusion region and store photo-charges therein, and a selector configured to selectively connect and disconnect the storage unit to and from the floating diffusion region in accordance with selection signals. The storage unit includes a capacitive element electrically connected to the floating diffusion region. The selector includes a switching element for selecting the pixel for connection to the floating diffusion region. The switching element is operated by the selection signals to selectively drive the capacitive element.

20 Claims, 5 Drawing Sheets

IMAGE SENSOR AND METHODS OF DRIVING AND FABRICATING THE SAME

RELATE APPLICATIONS

This application claims the benefit of Korean Patent Application No. 10-2011-0142587, filed on Dec. 26, 2011, which is hereby incorporated by reference as if fully set forth herein.

FIELD OF THE INVENTION

The present invention relates to an image sensor, and methods for making and using same. More particularly, the present invention relates to an image sensor having a wide dynamic range, and methods of driving and fabricating the same.

BACKGROUND. OF THE INVENTION

Light generated or reflected from objects present in the natural world have values of inherent wavelengths. Image sensors use a characteristic of semiconductor devices that are responsive to external light energy to capture an reflected. Each pixel within the image sensor senses the light generated from the object and converts the sensed light into an electrical signal.

Image sensors can be classified into a CCD (charge coupled device), which is based on a silicon semiconductor, and a CMOS (Complementary Metal Oxide Semiconductor) image sensor, which is fabricated using a sub-micron CMOS process.

Among these two types of image sensors, the CCD includes MOS (Metal Oxide Semiconductor) capacitors arranged adjacent to one another in which charge carriers are stored before being transferred. However, the CCD has a complex driving scheme, high power consumption, and a large number of mask processes, which hinders the integration of signal process circuits within the CCD. To overcome obese drawbacks, the CMOS image sensor is actively being researched and developed.

The CMOS image sensor has a photo diode (PD) and a plurality of MOS transistors formed within a unit pixel, and detects signals in a switching scheme to realize or recreate an image. Such CMOS image sensors have the advantages of lower fabrication cost, lower power consumption and easier integration with peripheral circuit chips, as compared to the CCD. More specifically, the CMOS image sensor is fabricated in the CMOS process as described above, and therefore, can be easily integrated with peripheral circuits such as amplifiers and signal processors. Therefore, the CMOS image sensor has a lower fabrication cost than CCD image sensors and has a relatively rapid processing speed. In addition, the CMOS image sensor can reduce power consumption to as low as 1 percent of that of a CCD.

However, conventional CMOS image sensors have a dynamic range disadvantage (e.g., a narrow or limited dynamic range). Dynamic range refers to the ratio between the largest and smallest pixel values in a unit frame. Namely, the conventional CMOS image sensor has difficulties in representing both very dark and very bright areas simultaneously in the unit frame.

To compensate for such a disadvantage of the CMOS image sensor, attempts nave been made to increase the capacitance of a floating diffusion region for every unit pixel to achieve a wide dynamic range.

FIG. 1 is a circuit diagram showing a unit pixel 100 in a CMOS image sensor having a wide dynamic range, in accordance with the related art. A unit pixel of the image sensor includes a photo diode PD, a transfer transistor Tx, a reset transistor Rx, a drive transistor Dx, a select transistor Sx, and a capacitance adjusting transistor Mx. The photodiode PD receives light and generates photocharges or photo current. The transfer transistor Tx transfers the photocharges generated by the photos PD to a floating diffusion region FD. The reset transistor Rx discharges the photocharges in the floating diffusion region FD to reset the floating diffusion region FD. The drive transistor Dx, which functions as a source follower buffer amplifier, amplifies and converts the photocharges in the floating diffusion region FD into a voltage signal. The select transistor Sx selects a unit pixel for addressing and/or reading. The capacitance adjusting transistor Mx allows a capacitor Cm to connect to or disconnect from the floating diffusion region FD.

In the unit pixel, the capacitor Cm may be connected to the floating diffusion region FD to increase the capacitance of the unit pixel when the floating diffusion region FD is nearly saturated by the photocharges transferred from the photodiode PD. However, since the capacitance is adjusted with respect to all of the pixels in a unit frame simultaneously, all of the pixels in the unit frame have an increased capacitance, although some of the pixels do not require the increased capacitance.

For example, as shown in the frame in FIG. 2A, first pixel and second pixel 2 are in a non-saturated state (e.g., as indicated by their respective semi-shaded areas) and third pixel 3 and fourth pixel 4 are in saturated state (e.g., as indicated by their respective non-shaded areas). In this case, although it is not necessary for the first and second pixels 1 and 2 to have an increased capacitance, in FIG. 2B, the first and second pixels 1 and 2 have increased capacitances along with the third and fourth pixels 3 and 4, to improve the visibility of the third and fourth pixels 3 and 4. However, the visibility of the first and second pixels 1 and 2 may decrease. As a result, it may cause a problem wherein the pixel values sensed by the first and second pixels 1 and 2 decrease (as shown by their respective shaded and semi-shaded areas), as shown in FIG. 2B. To solve this problem, an approach to increasing the gains of the first and second pixels 1 and 2 may be employed. In such an approach, the pixel values of the first and second pixels 1 and 2 in FIG. 2B increases. However, noise also increases accordingly.

SUMMARY OF THE INVENTION

In view of the above, the present invention provides an image sensor adapted to individually control a capacitance of a floating diffusion region of each pixel in a unit frame.

Further, the present invention provides a method for driving an image sensor by separately controlling a capacitance of the floating diffusion region of each pixel in a unit frame to realize a wider dynamic range of the image sensor.

In one aspect, the present invention relates to an image sensor comprising a plurality of pixels, wherein each of the pixels includes a storage unit configured to electrically connect to a floating diffusion region and store photocharges; and a selector configured to allow the storage unit to selectively connect to and disconnect from the floating diffusion region in response to first and second selection signals.

The storage unit may include a capacitive element which is connectable to the floating diffusion region, to store the photocharges. The selector may include a switching element for selecting the pixel to be activated by the one or more (e.g., row and column) selection signals to selectively drive the capacitive element.

Generally, at least one of the capacitive element and the switching element comprises a transistor (e.g., a MOSFET, JFET, etc.). In one embodiment, the switching element may include a first MOS transistor, and the capacitive element may include a second MOS transistor having a gate connected to a drain of the first MOS transistor. Additionally, a first (e.g., a row) selection signal may be applied to either a gate or a source of the first MOS transistor, and a second (e.g., a column) selection signal may be applied to the other one of the gate or source of the first MOS transistor. Furthermore, the floating diffusion region may be connected to a source or a drain of the second MOS transistor.

The image sensor may further include photoelectric converter configured to receive light and generate the photocharges; a transfer unit configured to transfer the photocharges in the photoelectric converter to the floating diffusion region; and an output unit configured to amplify and output a signal corresponding to the photocharges in the floating diffusion region and the storage unit.

The image sensor may include a plurality of light sensing units commonly connected to the floating diffusion region. Each of the light sensing units may include the photoelectric converter and the transfer unit.

In another aspect, the present invention relates to a method for driving an image sensor having a plurality of pixels, wherein each of the plurality of pixels has a floating diffusion region. Each floating diffusion region has a capacitance that can be adjusted for each individual pixel. In some embodiments, the method includes increasing the capacitance of the floating diffusion region for a first pixel among the plurality of pixels; outputting a voltage on the floating diffusion region of the first pixel as a reference voltage; transferring photocharges generated by the photodiode PD to the floating diffusion region of the first pixel; and providing the voltage on the floating diffusion region of the first pixel as a sensing voltage.

The method may further include resetting (e.g., discharging) an electrical potential of the floating diffusion region to a predetermined voltage.

In another aspect, the present invention, relates to an image sensor. Generally, the image sensor includes a plurality of pixels, each of the pixels including a capacitive element connected to a floating diffusion region of a first pixel in the plurality of pixels to be selectively activated; and a switching element coupled to the capacitive element and the floating diffusion region, and configured to select the capacitive element.

The switching element may be selectively driven by row and column selection signals to activate or deactivate (e.g., charge or discharge) the capacitive element.

The capacitive element and the switching element may each comprise one or more transistors (e.g., a MOSFET, JFET, etc.). Alternatively or additionally, the capacitive element may further comprise a capacitor or other capacitance (e.g., a high-impedance node).

BRIEF DESCRIPTION. OF THE DRAWINGS

The above and other objects, benefits, and features of the present invention will become apparent from the following description of exemplary embodiments given in conjunction with the accompanying drawings. The accompanying drawings illustrate embodiments of the invention and, along with the description, serve to explain the principles of the invention. In the drawings.

DETAILED DESCRIPTION OF THE EMBODIMENTS

The advantages and features of the present invention and the structures and methods of accomplishing these will be clearly understood from the following embodiments taken in conjunction with the accompanying drawings. However, the present invention is not limited to the following description and intended cover alternatives, modifications, and equivalents that may be included within the spirit and scope of the invention as defined in the appended claims. It should be noted that the present description of the embodiments is provided to describe and explain, but not limit, the invention.

That is, the embodiments described below may be implemented in various forms, and are provided to make a full disclosure of the invention and also to allow those skilled in the art to know the full range of the invention. Therefore, the present invention is to be defined by the scope of the appended claims.

Figure 3:
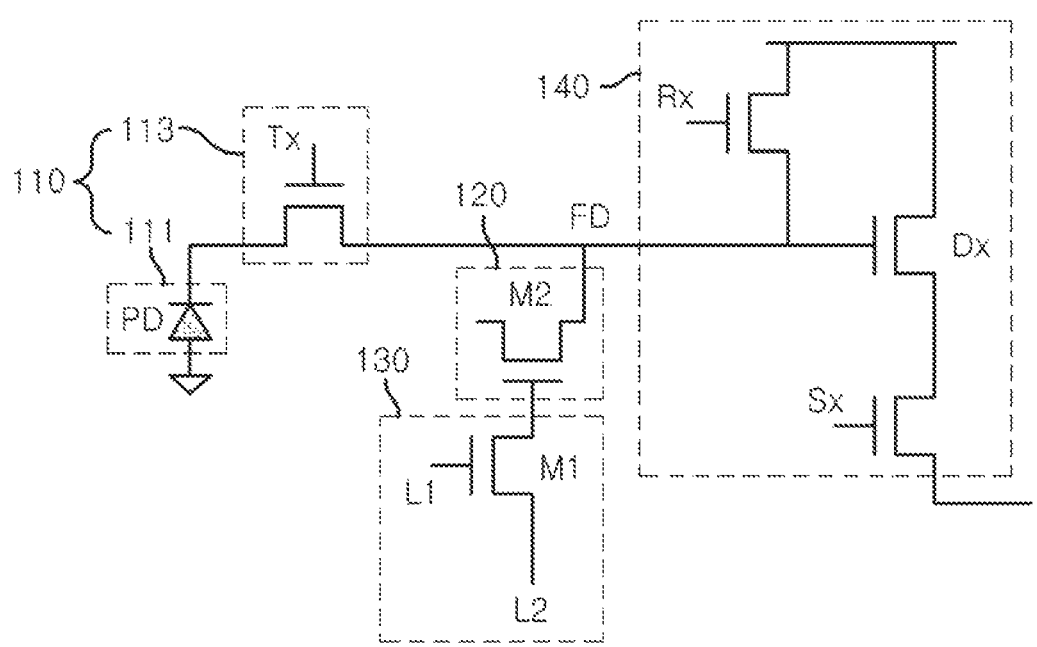
FIG. 3 is a circuit diagram illustrating a unit pixel in an image sensor providing a wide dynamic range, in accordance with a first embodiment of the present invention.

FIG. 3 is a circuit, diagram showing a unit pixel in an image sensor having a wide dynamic range, in accordance with a first embodiment of the present invention.

As shown in FIG. 3, an image sensor in accordance with the first embodiment includes a plurality of unit pixels, wherein each unit pixel includes a capacitive element 142 and a switching element M1. The capacitive element M2 is connected to a floating diffusion region FD of the pixel in such a manner as to be selectively driven. In some embodiments, the capacitive element M2 further includes a capacitor shown) or other capacitance at the source/drain terminal of transistor M2 opposite to that of the floating diffusion region FD. The switching element M1 selectively drives the capacitive element M2 of the unit pixel.

The unit pixel of the image sensor further includes a photoelectric converter 111 (e.g., a photodiode PD), a transfer unit 113, a storage unit 120 (e.g., comprising a MOS transistor), a selector or switch 130 and an output unit 140. The photoelectric converter 111 receives light and generates photocharges. The transfer unit 113 transfers the photocharges integrated in the photoelectric converter 111 to the floating diffusion region FD. The storage unit 120 is selectively connected to the floating diffusion region FD to store the photocharges (or add further charges). The selector 130 allows the storage unit 120 to be either electrically connected to or electrically disconnected from the floating diffusion region FD in accordance with row and column selection signals. The row and column selection signals can be provided by external circuitry coupled to the image sensor or a controller in the image sensor. The output unit 140 amplifies and outputs a signal (e.g., a voltage) corresponding to the photocharges stored in the floating diffusion region FD, and when activated, the storage unit 120.

As shown in FIG. 3, the photoelectric converter 111 and the transfer unit or transmitter 113 form a light sensing unit 110. The photoelectric converter 111 of the light sensing unit 110 may comprise a photodiode PD configured to receive light and generate the photocharges.

The transfer unit 113 of the light sensing unit 110 includes a switching element Tx which performs a switching operation to transfer the photocharges generated in the photoelectric converter 111 to the floating diffusion region FD. For example, the switching element Tx may comprise a transistor (e.g., a MOSFET, JFET, etc.) commonly utilized in image sensors.

The storage unit 120 includes a capacitive element M2 (e.g., a MOSFET) that is electrically connected to floating diffusion region FD that can store charges. In some embodiments, the capacitive element M2 of storage unit 120 comprises a MOS transistor. In further embodiments, storage unit 120 can further include a capacitor or other capacitive element that enables transistor M2 to charge or discharge a current or voltage (electrical charge) onto or from the floating diffusion region FD.

The selector 130 includes a switching element M1 for selecting a unit pixel in the CMOS image sensor. Selector 130 may be operated by first and second (e.g., row and column selection) signals provided at L1 and L2, and selector 130 performs a switching operation to selectively drive (e.g. charge or discharge) the capacitive element M2 of the storage unit 120. In some embodiments, the switching element M1 for the pixel selection may comprise a MOS transistor.

The exemplary connection configuration of the MOS transistors used for forming the storage unit 120 and the selector will now be described as follows. Pixel selection is performed by a first MOS transistor M1 in selector 130. Additional capacitance is added or omitted by a second MOS transistor M2 in storage unit 120. In this case, a first or row selection signal is applied to one of the gate L1 or source L2 of the first MOS transistor M1, and a second or column selection signal is applied to the other one of the gate L1 or source 12. Furthermore, the drain of the first MOS transistor M1 is connected to the gate of the second MOS transistor M2; a source (or a drain) of the second MOS transistor M2 is connected to floating diffusion region FD. The other of the drain (or source) of the second MOS transistor M2 is floating (e.g., not connected to discharge path in the image sensor circuitry) or connected to a capacitance (e.g., a MOS capacitor or the gate of a MOS transistor, the source and drain of which are connected to a ground potential).

Figure 1:
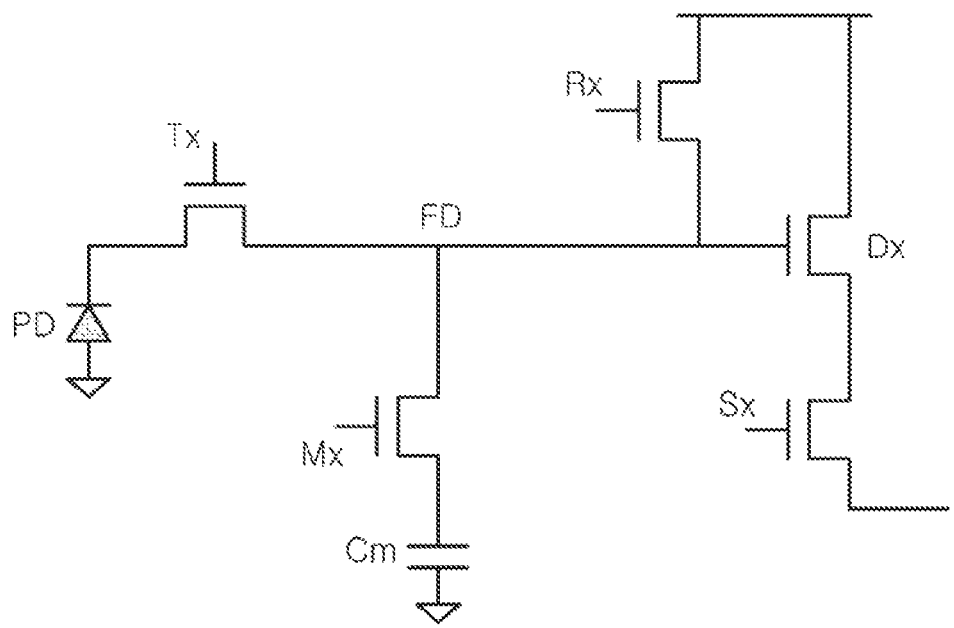
FIG. 1 is a circuit diagram showing a unit pixel in an image sensor, which realizes a wide dynamic range, in accordance with the related art.
Figure 2A:
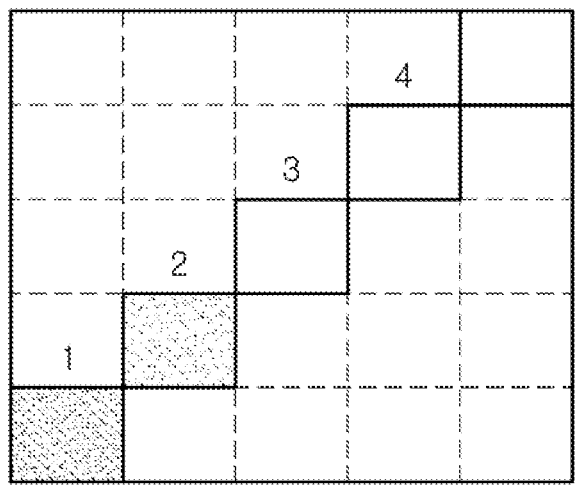
FIGS. 2A and 2B are diagrams illustrating luminance levels expressed by unit pixels in the image sensor shown in FIG. 1, where the luminance levels are depicted by light, and shade patterns in a unit frame.
Figure 2B:
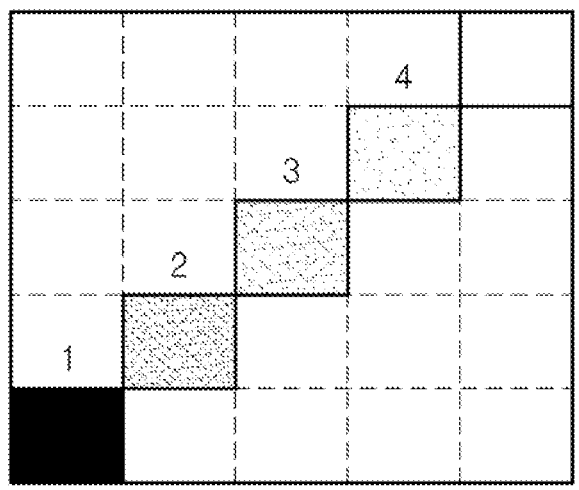

The output unit 140 includes a reset transistor Rx, a drive transistor Dx and a select transistor Sx, which may be the same as or similar to transistors Rx, Dx, and Sx discussed above with respect to FIG. 1. The reset transistor Rx discharges the photocharges stored on floating diffusion region FD to reset the floating diffusion region FD. In one embodiment, when the floating diffusion region FD is reset, the storage unit is also reset (e.g., by activating the first and second selection signals L1 and L2 provided to switch M1 in selector 130). The drive transistor Dx, which functions as a source follower (buffer) amplifier, amplifies and converts the photocharges stored on the floating diffusion region FD into a voltage. The select transistor Sx selects a pixel for providing the amplified voltage in response to a predetermined address.

Hereinafter, a method of driving the image sensor having a wide dynamic range as shown in the first embodiment of FIG. 3 will be described.

First, a first (or row) selection signal and a second (as column) selection signal are applied to the selector 130 (e.g., at gate L1 and source L2 of the switch M1) of a selected pixel among a plurality of pixels. Then, a floating diffusion region FD and a storage unit 120 in the selected pixel are electrically connected to each other to increase the capacitance of the floating diffusion region FD.

Figure 4A:
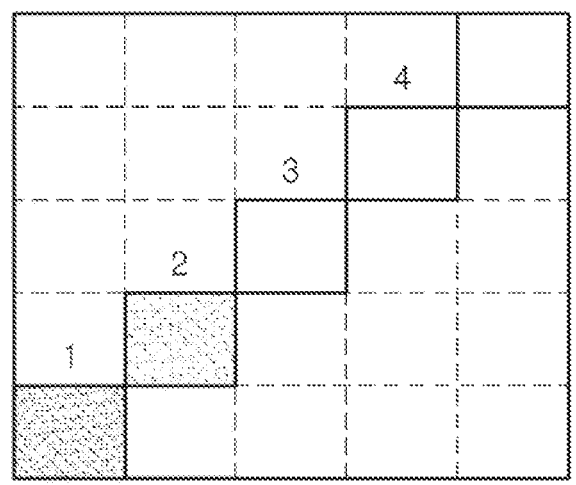
FIGS. 4A and 4B are diagrams illustrating luminance levels expressed by unit pixels in the image sensor shown in FIG. 3, where the luminance levels are depicted by light and shade patterns in a unit frame.

For example, as shown in the exemplary frame of FIG. 4A, pixel values generally cannot be read from third pixel 3 and fourth pixel 4 due to their saturated state. In order to select, the third and fourth pixels 3 and 4, a row selection signal is applied to the gate L1 or the source L2 of the MOS transistor M1 in the third pixel (and the fourth pixel) and a column selection signal is applied to the other terminal the source L2 or the gate L1) of the MOS transistor M1 in the third pixel (and the fourth pixel), thereby turning on or activating the first MOS transistor M1. A driving voltage is then applied to the gate of the second. MOS transistor M2 and flows from the drain of the first MOS transistor M1 to turn on or activate the second MOS transistor M2. That is, a voltage greater than that of the floating diffusion region FD (by at least a threshold voltage of the second MOS transistor M2) is applied to the gate of the second MOS transistor M2 to turn on or activate the second MOS transistor M2.

Accordingly, the second MOS transistor M2, which had been disconnected from the floating diffusion region FD prior to receiving a voltage from the drain of M1, is subsequently connected to the floating diffusion region FD and functions as a capacitor and stores photocharges generated by photoelectric converter 101. To put it another way, the capacitance of the floating diffusion region FD of the third pixel 3 and the fourth pixel 4 individually increases. Thus, the third and fourth pixels 3 and 4 shown in FIG. 4B have a wider dynamic range than the third and fourth pixels 3 and 4 in the unit frame shown in FIG. 4A.

Thereafter, the reset transistor Rx of output unit 140 is turned on or activated and resets (e.g., charges or discharges) an electrical potential of the floating diffusion region FD to the level of a supply voltage (e.g., Vcc). In one embodiment, when the electrical potential of the floating diffusion region FD is reset, the electrical potential of the storage unit is also reset (e.g., by activating the first and second selection signals L1 and L2 provided to switch M1 in switching element 130; see FIG. 3). After resetting the floating diffusion region FD, the reset transistor Mx of the output unit 140 is turned off or deactivated.

The output unit 140 then outputs the voltage of floating diffusion region FD as a reference voltage. More specifically, the select transistor Sx is turned on or activated and outputs the voltage on the floating diffusion region FD as a reference voltage, and the select transistor Sx is then turned off again.

Subsequently, the transfer transistor Tx of the transfer unit or transmitter 113 is turned on or activated to transition from a non-conductive state to a conductive state. Photocharges generated by the photo diode PD of the photoelectric converter 111 are transferred to the floating diffusion region FD. The photocharges may also be stored in a capacitor that is implemented by the second MOS transistor M2 of the storage unit 120 in the selected pixel.

Afterward, the output unit 140 provides the voltage on the floating diffusion region FD as a sensing voltage. More specifically, the select, transistor Sx is turned on or activated and outputs the voltage on the floating diffusion region FD as a sensing voltage on output terminal Sx. After outputting the sensing voltage, the select transistor Sx is turned off or placed in an inactive state. During the time duration in which the select transistor Sx is in an active state, the sensing voltage provided by the "non-selected" pixel (i.e., in which one or both of the signals L1 and L2 in selector 130 are inactive) includes only the voltage on the floating diffusion region. FD, while the sensing voltage provided by the "selected" pixel (i.e., in which the signals L1 and L2 in selector 130 are active) includes the voltage on the floating diffusion region FD as modified by the storage unit 120.

In this manner, the reference and sensing voltages are detected by and output from each of the selected and non-selected pixels in the image sensor. For the non-selected pixel, a pixel value is determined on the basis of a normal dynamic range representing a difference between the reference voltage and the sensing voltage. Meanwhile, for the selected pixel, a pixel value determined on the basis of a dynamic range that is wider than the normal dynamic range, depending on the difference between the reference voltage and the sensing voltage.

Figure 4B:
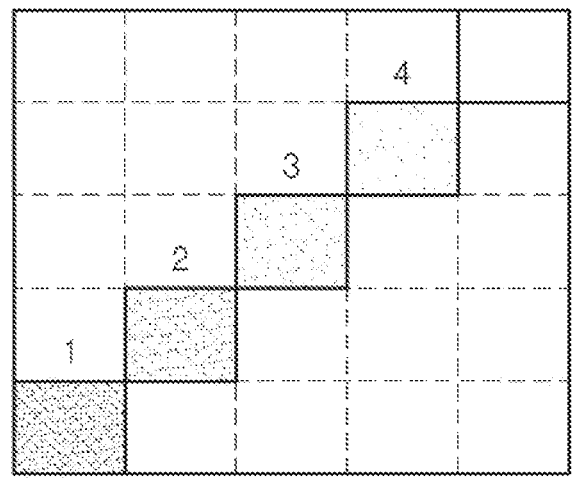

Referring to FIGS. 4A and 4B, the capacitance of the floating diffusion regions FD for the first and second pixels 1 and 2 in the unit frame does not increase, and the dynamic ranges of the first and second pixels 1 and 2 also does not increase. Thus, the corresponding first and second. Pixels 1 and 2 in the frame in FIG. 4B maintain the same luminance levels as the first and second pixels 1 and 2 in 4A. In contrast, when the capacitances of the floating diffusion regions FD of the third and fourth pixels 3 and 4 in FIG. 4A increases, the luminance levels of the third and fourth pixels have wider dynamic ranges than the dynamic range that would be obtained without the increased capacitance. Thus, the third and fourth pixels 3 and 4 in FIG. 4B have lower luminance levels (e.g., intensities) compared to those of the third and fourth pixels 3 and 4 in 4A. In some embodiments, circuitry (not shown) downstream from select or output transistor Sx can determine whether a pixel is at or near saturation (e.g., by determining that the difference between the reference voltage and the sensed voltage of the pixel is below a threshold), then activate the row and column selection signals at gate L1 and source L2 of switch M1 to add capacitance to the floating diffusion region FD.

Figure 5:
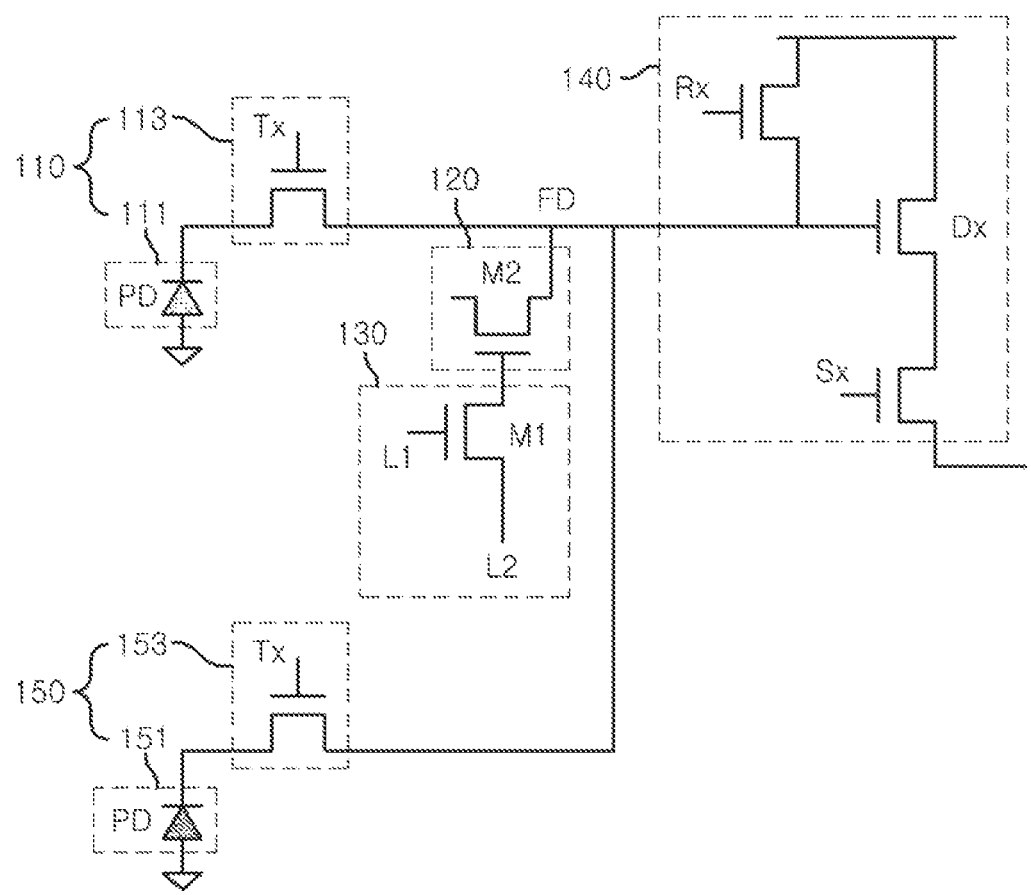
FIG. 5 is a circuit diagram illustrating a unit pixel in the image sensor, which realizes a wide dynamic range, in accordance with a second embodiment of the present invention.

FIG. 5 is circuit diagram illustrating an exemplary unit pixel in an image sensor having a wide dynamic range in accordance with a second embodiment of the present invention. The second embodiment of FIG. 5 is substantially identical to the first embodiment of FIG. 3, except that the second embodiment further includes an additional light sensing unit 150. Therefore, the description for the same configuration of the second embodiment as that of the first embodiment will be omitted to simplify the explanation thereof.

As illustrated in FIG. 5, in the unit pixel in the image sensor of the second embodiment, the additional light sensing unit 150 includes a photoelectric converter 151 and a transfer unit or transmitter 153 and is connected to the floating diffusion region FD. Alternatively, the unit pixel in the image sensor of the second embodiment may include one or more (e.g., a plurality of) additional light sensing units (not shown) the same as or similar to the light sensing units 110 and 150 that are commonly connected to the floating diffusion region FD.

According to embodiments of the present invention, image sensor allows the pixels not utilizing an increased capacitance to maintain their normal capacitances while exhibiting a wide dynamic range. By adjusting the capacitance of the floating diffusion region of certain pixels in the unit frame, wide dynamic range can be obtained. Therefore, the pixel values sensed by the respective pixels do not decrease, and it is possible to solve the problem of decreased luminance caused by a decreased pixel value. Furthermore, because it is not necessary to increase gain in order to solve the problem of decreased luminance, an increase in noise is fundamentally prevented.

While the description is directed toward embodiments of the present invention, the embodiments of the present invention are not limited hereto. It will be understood by those skilled in the art that various changes, equivalents, and modifications may be made without departing from the scope of the invention as defined in the following claims.

What is claimed is:

1. An image sensor comprising:
a plurality of pixels, each of the plurality of pixels including:
   a floating diffusion region;
   a storage unit configured to (i) connect to the floating diffusion region and (ii) store photocharges therein; and
   a selector including a switching element configured to receive first and second selection signals and selectively connect the storage unit to the floating diffusion region and disconnect the storage unit from the floating diffusion region in accordance with each of the first and second selection signals.

2. The image sensor of claim 1, wherein the storage unit includes a capacitive element electrically connected to the floating diffusion region.

3. The image sensor of claim 1, wherein each of the capacitive element and the switching element comprises a transistor.

4. The image sensor of claim 3, wherein the switching element includes a first MOS transistor;
the capacitive element includes a second MOS transistor having a gate electrically connected to a drain of the first MOS transistor;
the first selection signal is applied to a gate or a source of the first MOS transistor;
the second selection signal is applied to the other of the gate or source of the first MOS transistor; and
the floating diffusion region is connected to a source or drain of the second MOS transistor.

5. The image sensor of claim 1, further comprising:
a photoelectric converter configured to receive light and generate the photocharges;
a transfer unit configured to transfer the photocharges generated by the photoelectric converter to the floating diffusion region; and
an output unit configured to amplify and output a signal corresponding to the photocharges in the floating diffusion region and (when activated) the storage unit.

6. The image sensor of claim 5, comprising a plurality of light sensing units commonly connected to the floating diffusion region, wherein each light sensing unit includes the photoelectric converter and the transfer unit.

7. The image sensor of claim 1, wherein the first and second selection signals are configured to select a row and a column of the pixel.

8. The image sensor of claim 7, wherein the storage unit further comprises a capacitor.

9. The image sensor of claim 1, wherein each of the plurality of pixels further includes a select transistor configured to select the pixel in response to a predetermined address.

10. A method for driving an image sensor having a plurality of pixels, each pixel having a floating diffusion region with an adjustable capacitance, the method comprising:
increasing a capacitance of the floating diffusion region for a selected pixel of the plurality of pixels by selectively driving a switching element with first and second selection signals configured to (i) select a row and a column of the pixel and (ii) couple a capacitive element to the floating diffusion region;

outputting a voltage on the floating diffusion region of the selected pixel as a reference voltage;

transferring photocharges generated by a photoelectric converter to the floating diffusion region of the selected pixel having the increased capacitance; and outputting a voltage of the floating diffusion region of the selected pixel having the increased capacitance as a sensing voltage.

11. The method of claim 10, further comprising resetting an electrical potential of the floating diffusion region to a given voltage before outputting the voltage on the floating diffusion region as a reference voltage.

12. An image sensor comprising:
a plurality of pixels, each of the plurality of pixels including:
  a capacitive element selectively and electrically connectable to a floating diffusion region in the pixel; and
  a switching element configured to (i) be selectively driven by first and second selection signals, and (ii) couple the capacitive element to the floating diffusion region, wherein the first and second selection signals are configured to select a row and a column of the pixel.

13. The image sensor of claim 12, wherein the capacitive element comprises a first transistor.

14. The image sensor of claim 13, wherein the first transistor is a first MOSFET transistor.

15. The image sensor of claim 14, wherein the capacitive element further comprises a capacitor.

16. The image sensor of claim 15, wherein:
the first MOSFET transistor has a gate electrically connected to a drain of the second MOSFET transistor;
the first selection signal is applied to a gate or a source of the second MOSFET transistor;
the second selection signal is applied to the other of the gate or source of the second MOSFET transistor; and
the floating diffusion region is connected to a source or drain of the first MOSFET transistor.

17. The image sensor of claim 14, further comprising:
a photoelectric converter configured to receive light and generate the photocharges;
a transfer unit configured to transfer the photocharges generated by the photoelectric converter to the floating diffusion region; and
an output unit configured to amplify and output a signal corresponding to the photocharges in the floating diffusion region and (when activated) the storage unit.

18. The image sensor of claim 17, comprising a plurality of light sensing units commonly connected to the floating diffusion region, wherein each light sensing unit includes the photoelectric converter and the transfer unit.

19. The image sensor of claim 12, wherein the switching element comprises a second transistor.

20. The image sensor of claim 19, wherein the second transistor is a second MOSFET transistor.

* * * * *